United States Patent
Hardinger et al.

(10) Patent No.: US 11,710,759 B2
(45) Date of Patent: Jul. 25, 2023

(54) SINGLE CONTACT RELIEF PRINT GENERATOR

(71) Applicant: Integrated Biometrics, LLC, South Carolina, SC (US)

(72) Inventors: David A. Hardinger, Chandler, AZ (US); Spencer R. Canizales, Mesa, AZ (US); Sang Hoon Chae, SeJong-Si (KR); Frederick Frye, Simpsonville, SC (US); Dong Hyuk Jang, Hwaseong-shi (KR); Robert A. Kimball, Simpsonville, AZ (US)

(73) Assignee: Integrated Biometrics, LLC, Spartanburg, SC (US)

( * ) Notice: Subject to any disclaimer, the term of this patent is extended or adjusted under 35 U.S.C. 154(b) by 312 days.

(21) Appl. No.: 16/724,799

(22) Filed: Dec. 23, 2019

(65) Prior Publication Data
US 2021/0193729 A1    Jun. 24, 2021

(51) Int. Cl.
*G06V 40/13*   (2022.01)
*H01L 27/146*   (2006.01)
(Continued)

(52) U.S. Cl.
CPC .... *H01L 27/14678* (2013.01); *G06V 40/1318* (2022.01); *H01L 27/1462* (2013.01);
(Continued)

(58) Field of Classification Search
CPC ............ G06V 40/1318; H01L 27/1462; H01L 27/14623; H01L 27/14685;
(Continued)

(56) References Cited

U.S. PATENT DOCUMENTS 2,928,974 A     3/1960  Mash
6,440,814 B1 *  8/2002  Lepert ................ G06V 40/1329
                                                    369/126
(Continued)

FOREIGN PATENT DOCUMENTS

KR    10-2015-0119853 A     10/2015
KR    1020150119853 A  *   10/2015  ....... H01L 27/14831
KR    10-2017-0106425 A      9/2017

OTHER PUBLICATIONS

English machine translation of KR20150119853A. (Year: 2015).*
(Continued)

*Primary Examiner* — Stephen G Sherman
(74) *Attorney, Agent, or Firm* — Tucker Ellis LLP; Heather M. Barnes; Michael G. Craig

(57) ABSTRACT

One or more systems and/or methods are disclosed for building a relief print generator with no bezel. An electrode layer having more than one electrode can be used in an electrode-based, electro-luminescence component of the relief print generator. The respective electrodes may be connected to power sources with different voltage phases. An electrical circuit can be created between a biometric object and more than one electrode in the electrode layer when the biometric object contacts a surface of the generator. The electro-luminescent component can be activated by electrical charge and emit light indicative of a relief print of the biometric object. A contact electrode outside the electrode layer may not be used, which may allow for the removal of a bezel from an example device.

18 Claims, 12 Drawing Sheets

(51) Int. Cl.
*H01L 33/38* (2010.01)
*H01L 33/42* (2010.01)
*H01L 33/44* (2010.01)
*H01L 31/0376* (2006.01)
*H01L 31/173* (2006.01)
*H01L 31/113* (2006.01)

(52) U.S. Cl.
CPC .. *H01L 27/14623* (2013.01); *H01L 27/14685* (2013.01); *H01L 31/03762* (2013.01); *H01L 31/1136* (2013.01); *H01L 31/173* (2013.01); *H01L 33/38* (2013.01); *H01L 33/42* (2013.01); *H01L 33/44* (2013.01); *H01L 2933/0016* (2013.01); *H01L 2933/0025* (2013.01)

(58) Field of Classification Search
CPC ......... H01L 27/14678; H01L 31/03762; H01L 31/1136; H01L 31/173; H01L 33/38; H01L 33/42; H01L 33/44; H01L 2933/0016; H01L 2933/0025
See application file for complete search history.

(56) References Cited

U.S. PATENT DOCUMENTS

| | | |
|---|---|---|
| 10,573,769 B2 | 2/2020 | Miyazaki et al. |
| 2015/0161430 A1 | 6/2015 | Saito |
| 2018/0025200 A1 | 1/2018 | Frye et al. |
| 2019/0050618 A1 | 2/2019 | Khuri-Yakub et al. |

OTHER PUBLICATIONS

The International Search Report and The Written Opinion from corresponding International Application No. PCT/2020/065996, dated Apr. 22, 2021, 12 pages.

Eui Hyuk Kim et al. Organic light emitting board for dynamic interactive display. nature Communications, Apr. 13, 2017, DOI: 10.1038/ncomms14964, 8 pages.

* cited by examiner

SINGLE CONTACT RELIEF PRINT GENERATOR

BACKGROUND

A biometric relief print generator device, such as a fingerprint recognition device, is used for various purposes including security check, identity verification. A person's body-part can contact the generator, where a relief print image may be captured of the body-part, such as a fingerprint. The biometric relief print generator device may use an electrode-based, electro-luminescence component that can utilize an electrical connection between a relief object and the electro-luminescence component. To complete the electrical connection, a body-part, such as a finger, typically needs to contact both a surface of the device and a contact electrode, which is usually built in a bezel disposed at a perimeter of the surface. Having a bezel makes the device heavy, bulky and less portable. In addition, it is sometimes difficult and inconvenient to have a finger contact a surface and a bezel at the same time, especially for young children and people with rheumatic diseases.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

As provided herein, systems and methods are disclosed for incorporating more than one electrode in an electrode layer, which may allow for a device without a contact electrode, resulting in a more useful and user-friendly biometric relief print generator device.

In one implementation of a system for generating a relief print image, an electrode layer in a light emitting layer comprises multiple electrodes. In this implementation, the electrodes may be electrically connected to different power sources, thereby voltage characteristics on respective electrodes can be different at a given time. For example, when a biometric object touches a surface of a relief print generator device, an electrical circuit can be created between the biometric object and more than one electrode in the electrode layer. In this way, an electro-luminescent component can be activated by electrical charge, and emit light indicative of a relief print of the biometric object.

In one implementation of a method for fabricating an electrode layer with more than one electrode, a transparent single-electrode panel can be utilized. In this implementation, the transparent single-electrode panel can be scribed using laser. Further a dielectric bridge layer may be disposed over the scribed single-electrode panel to provide insulation, and a conductive crossover layer may be disposed over the dielectric bridge layer to provide electrical connection. In this way, an electrode layer with more than one electrode can be created.

To the accomplishment of the foregoing and related ends, the following description and annexed drawings set forth certain illustrative aspects and implementations. These are indicative of but a few of the various ways in which one or more aspects may be employed. Other aspects, advantages and novel features of the disclosure will become apparent from the following detailed description when considered in conjunction with the annexed drawings.

BRIEF DESCRIPTION OF THE DRAWINGS

What is disclosed herein may take physical form in certain parts and arrangement of parts, and will be described in detail in this specification and illustrated in the accompanying drawings which form a part hereof and wherein.

DETAILED DESCRIPTION

Figure 1:
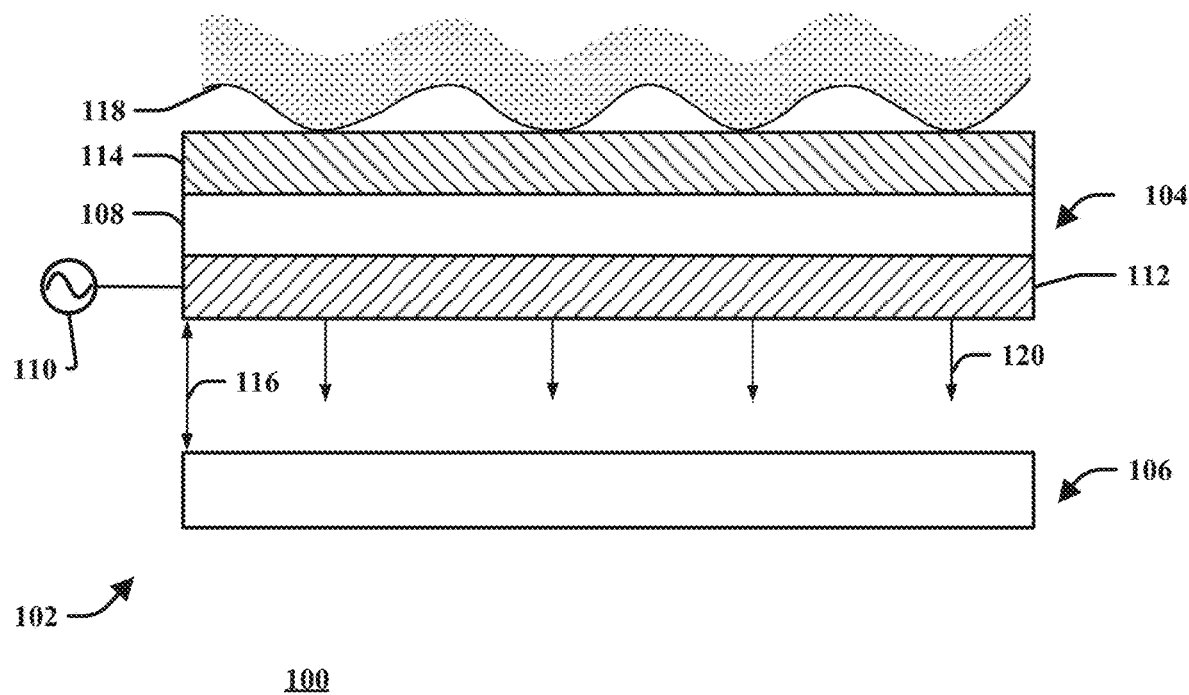
FIG. 1 is a component diagram illustrating an example body-part relief print generation environment where one or more portions of one or more techniques and/or one or more systems described herein may be implemented.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices may be shown in block diagram form in order to facilitate describing the claimed subject matter.

FIG. 1 is a component diagram illustrating an example biometric relief print generation environment 100 where one or more portions of one or more techniques and/or one or more systems described herein may be implemented. As shown in the example environment 100, an example biometric relief print generation system 102, such as a fingerprint recognition system, may comprise a light emitting layer 104 that is configured to emit one or more photons 120 from a portion of the light-emitting layer 104 that receives contact from a biometric object 118. The example biometric relief print generation system 102 may further comprise a sensor arrangement 106.

In one implementation, the light emitting layer 104 may comprise an electrode-based (e.g., single electrode, multiple electrodes), electro-luminescent layer 108, and/or an electrical connection 110 (e.g., a power source, such as an A/C source), which may provide an electrical power to activate the electro-luminescent layer 108. Further, in one implementation, the light emitting layer 104 may comprise an electrode layer 112 (e.g., comprising an indium tin oxide (ITO) material, which may be attached to a polymer substrate), and/or a dielectric layer 114 (e.g., a conductive/insulating layer that allows current to pass). In one implementation, the light emitting layer 104 and the sensor arrangement 106 may be separated at a distance 116 to each other or may be arranged such that the sensor arrangement 106 is in contact with the light emitting layer 104. As one example, when a biometric relief print generation system 102 is activated (e.g., by placing a finger at a scanning surface), light produced by the light emitting layer 104 is emitted in respective directions, such as directed toward the sensor arrangement 106.

In one implementation, the sensor arrangement 106 can be operably engaged with the light emitting layer 104, such that the sensor arrangement 106 is disposed in a path of the directions of the emitted photons 120. The sensor arrangement 106 may comprise an image sensor that can convert an optical image into an electronic signal, for example, for digital processing of a captured optical image. That is, for example, the image sensor may comprise photosensitive material that results in an electrical signal being produced when one or more photons 120 impact the material. In this way, for example, a location and/or number of photons impacting the sensor arrangement 106 may be indicated by a number (e.g., or power) of electrical signals, from an area of the sensor arrangement 106 subjected to the photon 152 impacts. In one implementation, the resulting electrical signals may comprise data indicative of a representation (e.g., image) of the contact area(s) of the biometric object 118.

In one implementation, the image capture component 106 may comprise an active pixel sensor (APS) or passive pixel sensor (PPS), such as a thin film sensor (e.g., photo-sensitive thin film transistor (TFT), thin film photo-diode, photo-conductor) or complementary metal-oxide semiconductor (CMOS). As another example, the sensor arrangement 106 may comprise a charge-coupled device (CCD), a contact image sensor (CIS), or some other light sensor that can convert photons into an electrical signal. Of note, the illustration of FIG. 1 is merely an exemplary implementation of the biometric relief print generation system 102 and is not intended to provide any limitations. That is, for example, the distance 116 illustrated between the light emitting layer 104 and the sensor arrangement 106 is exaggerated for purposes of explanation, and may or may not be present in the exemplary biometric relief print generation system 102.

Figure 2:
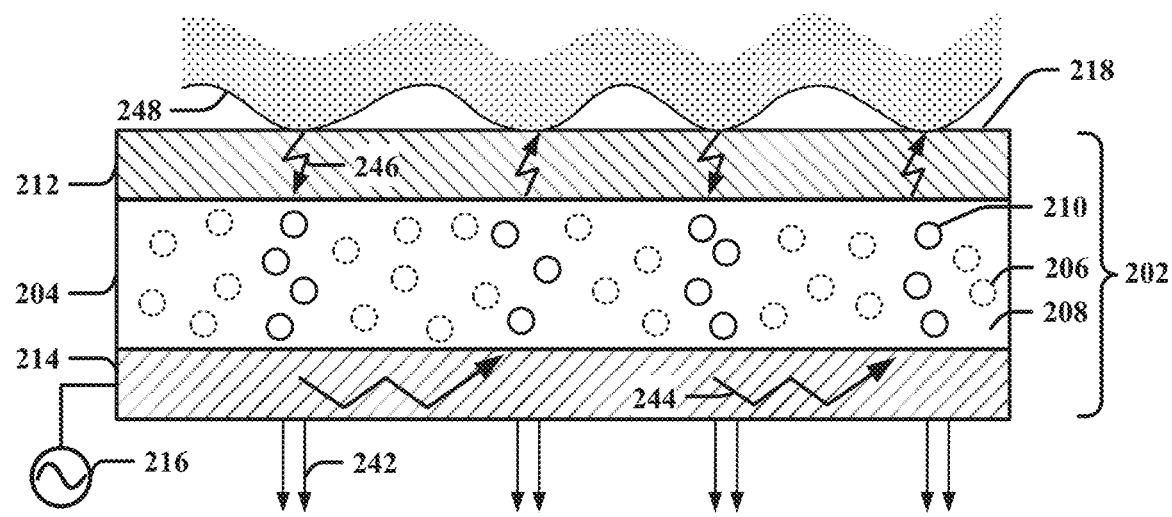
FIG. 2 illustrates an example implementation where one or more portions of one or more techniques described herein may be implemented.

As an illustrative example, FIG. 2 is a component diagram illustrating an example implementation 200, where one or more portions of one or more techniques and/or one or more systems described herein may be implemented. The example implementation 200 may comprise a portion of a light emitting layer (e.g., 104 of FIG. 1) that can be utilized in a relief print generator.

In FIG. 2, an example implementation of a portion of a light emitting layer 202 can comprise an electro-luminescent layer 204. In this implementation 200, the electro-luminescent layer 204 can be comprised of electro-luminescent particles 206 (e.g., quantum dots and fluorescent particles, such as phosphor-based materials, such as phosphor-based inorganic crystal materials with a transitional metal as a dopant or activator, zinc sulfide-based materials, cadmium sulfide-based materials, gallium-based materials, other semi-conductor materials, etc.) and a binder material 208. In one implementation, when a biometric object 248 (e.g., finger or other body part) contacts the light emitting layer 202 and provides the electrical charge 246, the electro-luminescent particles 206 may be converted to activated particles 210, when subjected to the electrical charge 246, merely at the location of the touch. Further, in this implementation, the activated particles 210 may emit photons 242, for example, thereby producing light when subjected to the electrical charge 246.

In FIG. 2, the example implementation of the portion of the light emitting layer 202 can comprise a dielectric layer 212 and an electrode layer 214. In this example implementation 200, the dielectric layer 212 is resident over the top portion of, and in contact with, the electro-luminescent layer 204. The electrode layer 214 is resident under the bottom portion of, and in contact with, the electro-luminescent layer 204. Further, the example implementation 200 of the portion of the light emitting layer 202 can comprise a power source 216, such as an alternating current (AC) power source in electrical connection with the electrode layer 214.

In one implementation, a biometric object 248 may contact the scanning surface 218 (e.g., top layer of the light emitting layer 202). In this implementation, for example, upon contacting the scanning surface 218, an electrical circuit may be created by the potential difference between the electrical potential of a human (e.g., provided by membrane potential) and an electrical potential of the electrode layer 214, thereby allowing current 242 to flow inside some portion of the electro-luminescent layer 204. Additionally, the current 242 passing through the dielectric layer 212 can activate the electro-luminescent particles 204 merely at the location of the contact. Upon activation, the activated particles 210 may emit photons 242 merely at the location of the contact of the portions of the biometric object 248 (e.g., fingerprint ridges). In this way, for example, an illuminated relief print (e.g., fingerprint) of the biometric object 248 (e.g., finger) may be produced when the biometric object 248 contacts the scanning surface 218.

Figure 3:
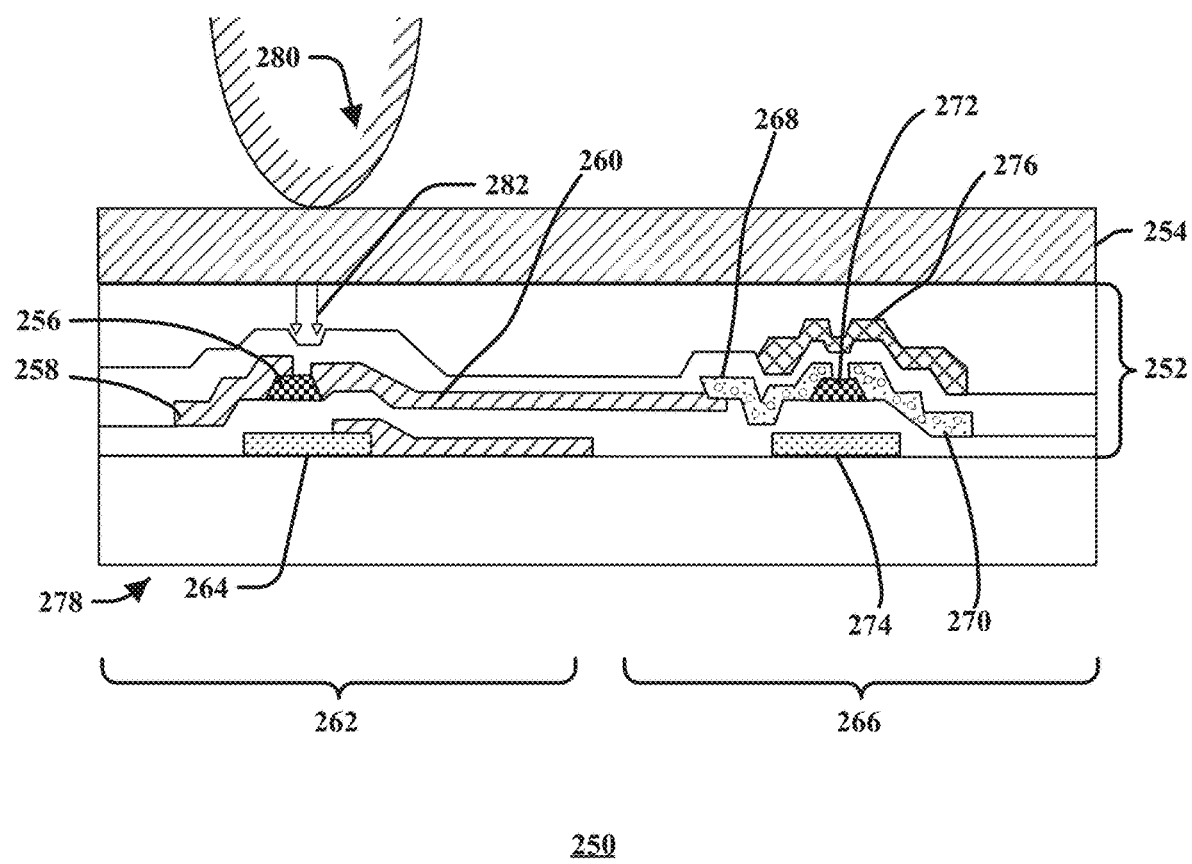
FIG. 3 illustrates an example implementation where one or more portions of one or more techniques described herein may be implemented.

As an illustrative example, FIG. 3 is a component diagram illustrating an example implementation 300, where one or more portions of one or more techniques and/or one or more systems described herein may be implemented. The example implementation 250 may comprise a portion of a senor arrangement (e.g., 106 of FIG. 1) that can be utilized in a relief print generator.

As shown in FIG. 3, a relief print scanner can comprise an image sensor 252 that may be used to capture an optical image (e.g., an image of a fingerprint) by converting incoming photons into an electronic signal, for example, for digital processing of the captured image. In one implementation, the image sensor 252 may comprise a thin film sensor array. For example, a thin film sensor-array may be used to detect photons emitted by a light emitting component 254 (e.g., the light emitting layer 202 of FIG. 2). Here, as an example, the image sensor 252 can detect light produced by the light emitting component 254 (e.g., produced in the form of a relief print) and produce an image using a photo-current, by converting the detected photons into an electrical signal.

In the example implementation 250, a photo-sensitive layer 256 (e.g., comprising SiH, amorphous silicon) may be formed between a first source electrode 258 and a first drain electrode 260 of a light sensing unit 262. When an electrical charge is applied to a first gate electrode 264, the photo-sensitive layer 256 becomes responsive to light, for example, where the photo-sensitive layer 256 may become electrically conductive when incident to photons of light. As one example, when light is incident on the photo-sensitive layer 256 over a predetermined, threshold light amount, the first source electrode 258 and the first drain electrode 260 may become electrically connected. Therefore, in this example, light generated from the light emitting component 254 (e.g., comprising a fingerprint pattern) may be received by the photo-sensitive layer 256, which may cause an electrical signal to pass from the first source electrode 258 to the first drain electrode 260, providing an electronic signal indicative of the light received.

Further, a switching unit 266 of the image sensor 252 can comprise a second source electrode 268, a second drain electrode 270 and an intrinsic semiconductor layer 272. As one example, when a negative charge is applied to a second gate electrode 274, the intrinsic semiconductor layer 272 may become electrically conductive, thereby allowing the electrical signal created at the light sensing unit 262 to pass from the second source electrode to the second drain electrode (e.g., and to an electrical signal reading component for converting to a digital image). In this way, for example, the switching unit 266 may be used to control when an electrical signal indicative of a particular amount of light may be sent to an electrical signal reading component (e.g., for processing purposes and/or to mitigate signal interference with neighboring light sensing units).

Additionally, in this implementation 250, a light shielding layer 276 may be resident over the top portion of the switching unit 266. As one example, the light shielding layer 276 may mitigate intrusion of light to the intrinsic semiconductor layer 272, as light can affect the electrical conductivity of the intrinsic semiconductor layer 272. The image sensor 252 may also comprise a substrate 278 of any suitable material, onto which the layers of the image sensor 252 may be formed. As one example, when a biometric object 280 (e.g., 244 of FIG. 2A) comes into contact with a contact surface (e.g., top surface) of the light emitting component 254, an electrical current may pass through the biometric object 280, and into the light emitting component 254. In this example, the light emitting component 254 may emit photons 282 that are incident to the photo-sensitive layer 256, thereby allowing an electrical signal (e.g., indicative of the number of photons received) to pass from the first source electrode 258 to the second drain electrode 270, and to a signal reading component.

Figure 4A:
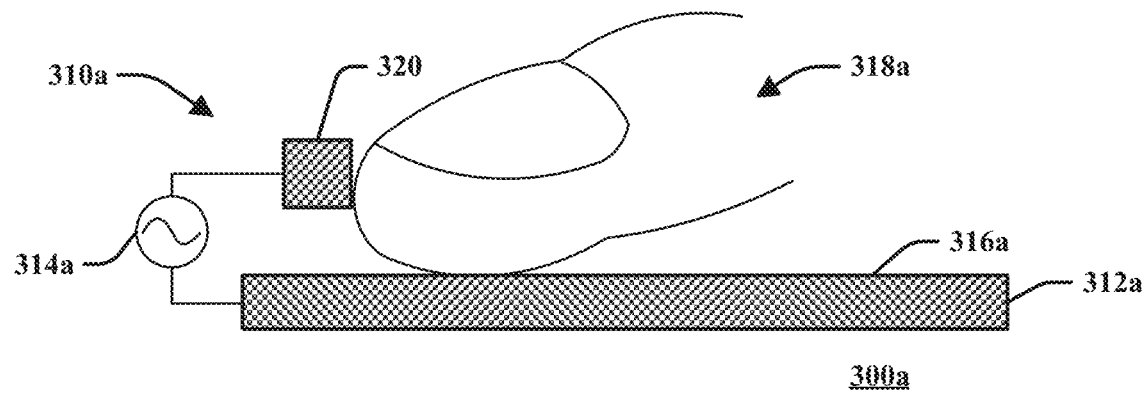
FIG. 4A is a component diagram illustrating an example implementation from a prior art.
Figure 4B:
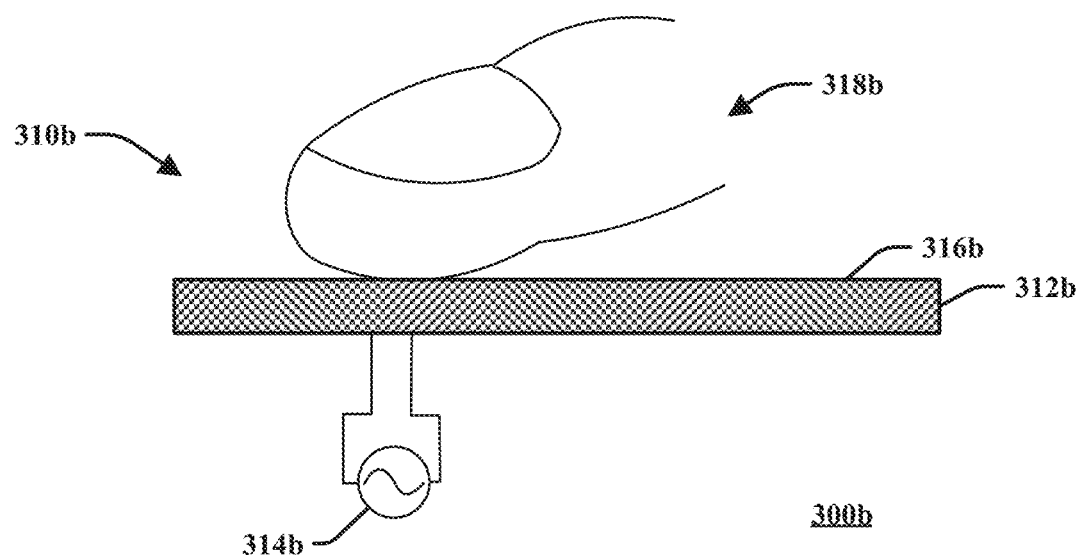
FIG. 4B is a component diagram illustrating an example implementation, where one or more portions of one or more techniques described herein may be implemented.

FIG. 4A is a component diagram illustrating an example implementation 300a where one or more portion of one or more techniques may be implemented. FIG. 4B is a component diagram illustrating an example implementation 300b where one or more portion of one or more techniques described herein may be implemented. FIGS. 4A, 4B together illustrates an improvement on one or more portion of one or more techniques.

The example implementation 300a of the portion of the biometric relief print generator 310a can comprise a light emitting component 312a and an electrical connection 314a (e.g., a power source, such as an A/C source). Further, in one implementation, the biometric relief print generator 310a may comprise a contact electrode 320. The contact electrode 320 can comprise a conductive element disposed at least partially around a perimeter of a scanning surface 316a (e.g. 218 of FIG. 2). The electrical connection can electrically connect the contract electrode 320 and an electrode layer (e.g., 214 of FIG. 2). In this way, for example, when a biometric object 318a contacts both a scanning surface 316a and at least a portion of the contact electrode 320, an electrical circuit may be created between the contact electrode 320 and the electrical layer, thereby allowing current to flow between the contact electrode 320 and the electrode layer. For example, electrical charge (e.g., 246 of FIG. 2) may move from the contact electrode 320, through at least a portion of the biometric object 318a, to the electrode layer disposed under and in contact with an electro-luminescent layer (e.g., 204 of FIG. 2). As described in FIG. 2, in one implementation, when electrical charge is provided for the light-emitting layer 202, the electro-luminescent particles 206 may be converted to activated particles 210 and emit photons 242 at the location of the electrical charge 246. In this way, for example, an illuminated relief print (e.g., fingerprint) of the biometric object 318a (e.g., finger) may be produced when the biometric object 318a contacts both the contact electrode 320 and the scanning surface 316a.

In one respect, the need to incorporate a contact electrode 320 in a biometric relief print generator 310a can limit the use of the generator 310a. Contact electrodes can be incorporated in a bezel around at least a portion of a perimeter of a scanning surface of the biometric relief print generator, which may make the generator bulky in size and heavy in weight. In another respect, in one implementation of one relief print generation environment, a fingerprint image may be generated upon a finger contacting both the contact electrode (e.g., a bezel) and the scanning surface. It may be difficult for small children to lay their fingers flat on a surface, thereby consuming more time to finish the fingerprint scanning and/or identification. Additionally, having a finger contacting both a scanning surface and a contact electrode at the periphery of the scanning surface may be physically difficult for people with rheumatic diseases or Parkinson diseases, and other users may merely misalign their fingers, taking more time and effort to collect images of prints.

As illustrated in FIG. 4B, in the example implementation 300b, a contact electrode may not be present in the example device. The example implementation 300b of the portion of the biometric relief print generator 310b can comprise a light emitting component 312b and an electrical connection 314b (e.g., multiple power sources with different voltage phases, such as an A/C source). The electrical connection 314b can be electrically connected to an electrode layer (e.g., 214 of FIG. 2). In addition, the electrode layer may comprise more than one electrode having different electrical potentials at a given time. In this way, for example, when a biometric object 318b contacts at least of a portion of a scanning surface 316b, an electrical circuit may be created between the biometric object 318 and two or more electrodes in the electrode layer, thereby allowing current to flow through the light emitting component 312b between the biometric object 318b and the electrode layer. For example, electrical charge (e.g., 246 of FIG. 2) may move from the biometric object 318b, through the light emitting component 312b to a first electrode in the electrode layer, to a second electrode on the electrode layer, and through the light emitting component 312b back to the biometric object 318b. As described in FIG.

2, in one implementation, when electrical charge is provided for the light-emitting layer 202, the electro-luminescent layer 204 may emit photons 242 at the location of the electrical charge 246. In this way, for example, an illuminated relief print (e.g., fingerprint) of the biometric object 318b (e.g., finger) may be produced when the biometric object 318b contacts the scanning surface 316b.

Figure 5:
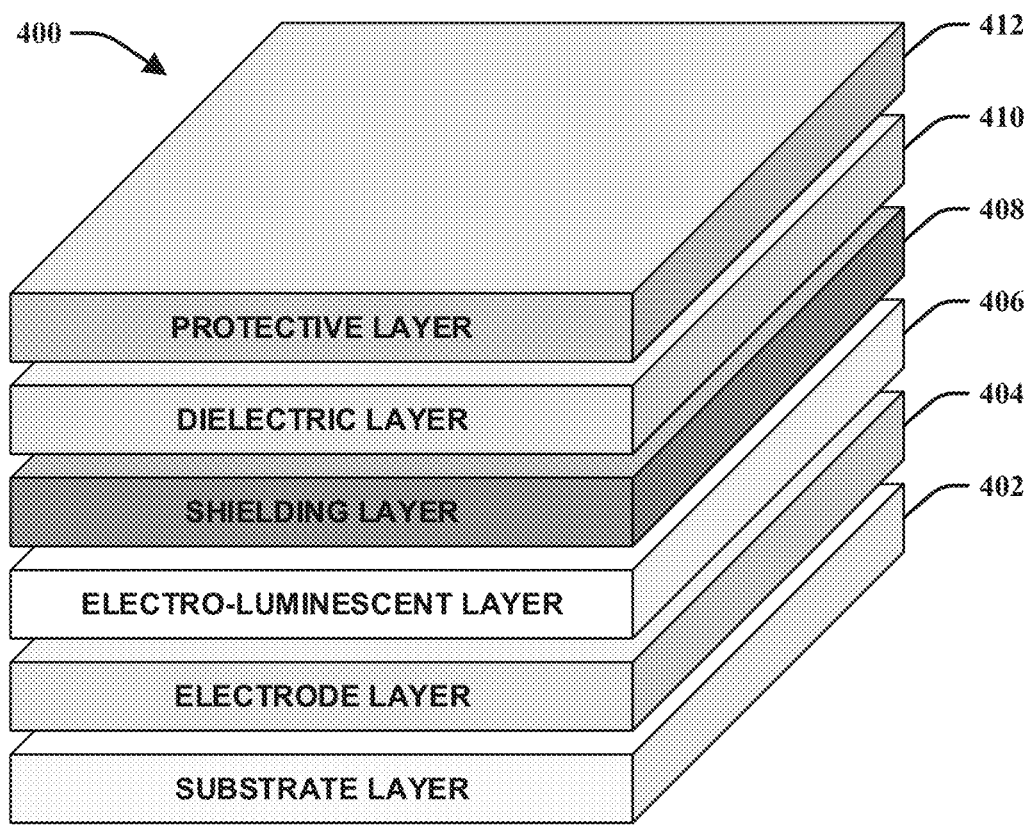
FIG. 5 is a component diagram illustrating an example implementation of at least a portion of one or more systems described herein.

FIG. 5 illustrates a component diagram of an example implementation of one or more portions of one or more systems described herein. As an example, a light emitting layer 400 may comprise one or more layers, and may be used to generate photons at a location of a biometric object's touch to the surface of the light emitting layer 400. In the example implementation of FIG. 5, the light emitting layer 400 can comprise a transparent, insulating substrate layer 402. As an example, the substrate layer 402 may comprise any suitable material (e.g., glass, polymer, polyester, etc.) configured to perform as a substrate onto which the other layers may be formed, and which comprise an optically transparent material.

Further, the example light emitting layer 400 can comprise an electrode layer 404 having more than one electrode, the electrode layer can comprise any suitable, transparent conducting film. More details about the electrode layer will be illustrated below with reference to FIGS. 6, 7, 8. In some implementations, a reinforcement layer (not shown) may be disposed on top of the electrode layer 404. As an example, the reinforcement layer may be comprised of any suitable material that can be configured to provide some rigidity and reinforcement between an electro-luminescent layer 406 and the electrode layer 404. The electro-luminescent layer 406 (e.g., 204 of FIG. 2) can be configured to convert an electrical charge into photons indicative of a location and strength of the electrical field, as described above. That is, for example, a user's finger may provide a conduit for an electrical charge to the electro-luminescent layer 406, which can convert electro-luminescent particles in the layer 406 into activated particles, thereby releasing one or more photons in response to the electrical charge.

As illustrated in FIG. 5, in one example, the light emitting layer 400 can comprise a shielding layer 408, disposed on top of the electro-luminescent layer 406. The shielding layer 408 may be comprised of any suitable material that can be configured to mitigate emission of photons from the top surface of the electro-luminescence layer 406, for example, by providing a light blocking ability; and may be appropriately deposited, and remain resident, on the electro-luminescent layer 406. In this way, for example, photons released by the electro-luminescent layer 406 can merely be directed toward the bottom of the light emitting layer 400 (e.g., toward an image sensor). A dielectric layer 410 can be disposed on top of the shielding layer 408, and may be configured to provide insulation and pass electrical current when appropriate, as described above (e.g., 212 of FIG. 2). Further, a protective layer 412 may be deposited on top of the dielectric layer 410. The protective layer 412 can be configured to mitigate physical damage to the surface of the light emitting layer 400 and provide protection from liquids. Additionally, the protective layer may comprise an abrasion resistive layer, a liquid resistive layer, and/or a shock resistive layer to mitigate the electrical charge passing to the biometric object (e.g. finger). Further, in one implementation, a surface of the protective layer 412 may be used as a scanning surface (e.g., 218 of FIG. 2) where a biometric object contacts to active the electro-luminescent layer 406.

Additionally, two or more of the shielding layer 408, the dielectric layer 410 and the protective layer 412 can be integrally formed into a single layer. For example, the shielding layer 408 and the dielectric layer can be integrally formed into an opaque dielectric layer. The opaque dielectric layer may be configured to provide insulation and pass electrical current when appropriate, and to mitigate emission of photons from the top surface of the electro-luminescence layer 406. As another example, the shielding layer 408, the dielectric layer 410 and the protective layer 412 can be integrally formed into a top layer disposed over the electro-luminescent layer 406. The top layer can be configured to provide insulation and pass electrical current, to mitigate photons from the top surface of the electro-luminescent layer 406, and also to mitigate physical damage to the light emitting layer 400 and to serve as a scanning surface (e.g., 218 of FIG. 2) of the biometric relief print generator.

As an illustrative example, the exemplary light emitting layer 400 may comprise a contact light emitting device, made up of one or more of the example layers 402-412. In this example, when an electric field is formed between an object to be imaged, such as a biometric object (e.g., one or more fingers or a hand) and the electrode layer 404, the electro-luminescent layer 406 can emit photons indicative of an image of at least a portion of the biometric object.

Figure 6:
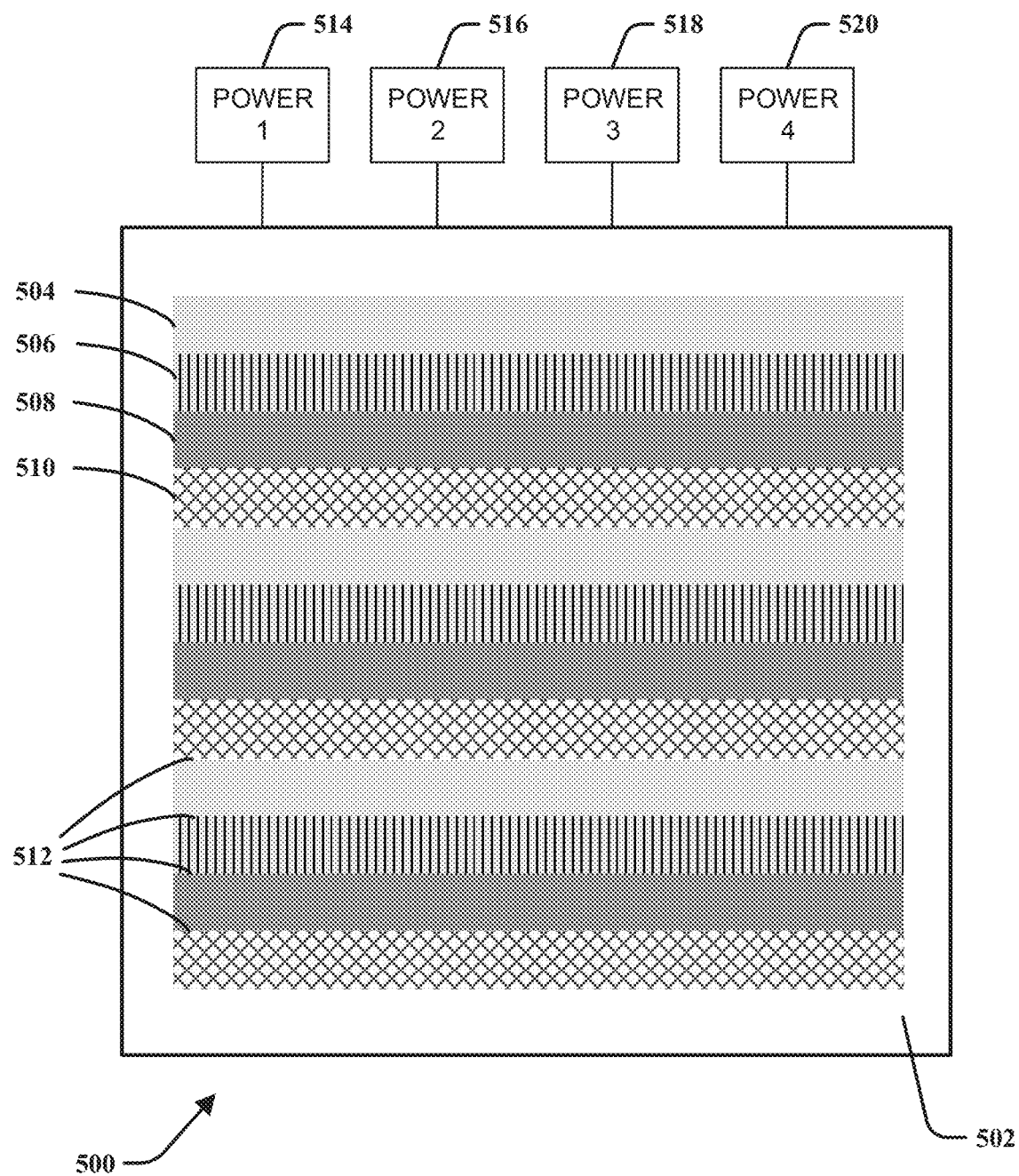
FIG. 6 is a component diagram illustrating an example implementation of at least a portion of one or more systems described herein.

FIG. 6 illustrates a component diagram of an example implementation of one or more portions of one or more systems described herein. As an example, an electrode layer 500 may comprise a transparent, insulating electrode layer substrate 502. As an example, the electrode layer substrate 502 may comprise any suitable insulating material (e.g., glass, polymer, polyester, etc.) configured to perform as a substrate onto which the other layers may be formed, and which comprise an optically transparent material. The substrate layer (e.g., 402 of FIG. 5) may function as the electrode layer substrate 502. In the example implementation of FIG. 6, the electrode layer 500 may further comprise more than one electrode (e.g., four electrodes). A first electrode 504, a second electrode 506, a third electrode 508 and a fourth electrode 510 may be disposed adjacent to one another and separated by an electrode gap 512 to each other. As an example, the gap distance may be less than 1 pixel wide and therefore may not create detectable interference (e.g., visible lines) that could compromise the quality of the relief print of a biometric object (e.g., a fingerprint.).

In the electrode layer 500 of the example implementation in FIG. 6, the first electrode 504, the second electrode 506, the third electrode 508, and the fourth electrode 510 can be electrically connected to a first power source 514, a second power source 516, a third power source 518, and a fourth power source 520, respectively. In this way, for example, respective electrodes 504, 506, 508, 510 can be provided electrical power with different characteristics. In some examples, the power sources 514, 516, 518, 520 can comprise A/C sources. Further, in some implementations, respective power sources 514, 516, 518, 520 can provide different voltage phases. That is, the characteristics (e.g., phases) of the A/C voltage provided to the electrodes 504, 506, 508, 510 by corresponding power sources 514, 516, 518, 520 may be different for each electrode. In this way, at a given time, the electrical potential of different electrodes 514, 516, 518, 520 can be different. As described in FIG. 4B, above, this may allow the device to provide an electrical circuit between a biometric object and more than one electrode, which can mitigate the use of a contact electrode in a biometric relief print generator.

Of note, the illustration of FIG. 6 is merely an exemplary implementation of the electrode layer 500 and is not intended to provide any limitations. The number of electrodes in the electrode layer is not limited to four. That is, for example, there may be less than four or more than four electrodes in the electrode layer. Further, electrodes in an electrode layer may be disposed in a different fashion from the illustration of FIG. 6.

Figure 7:
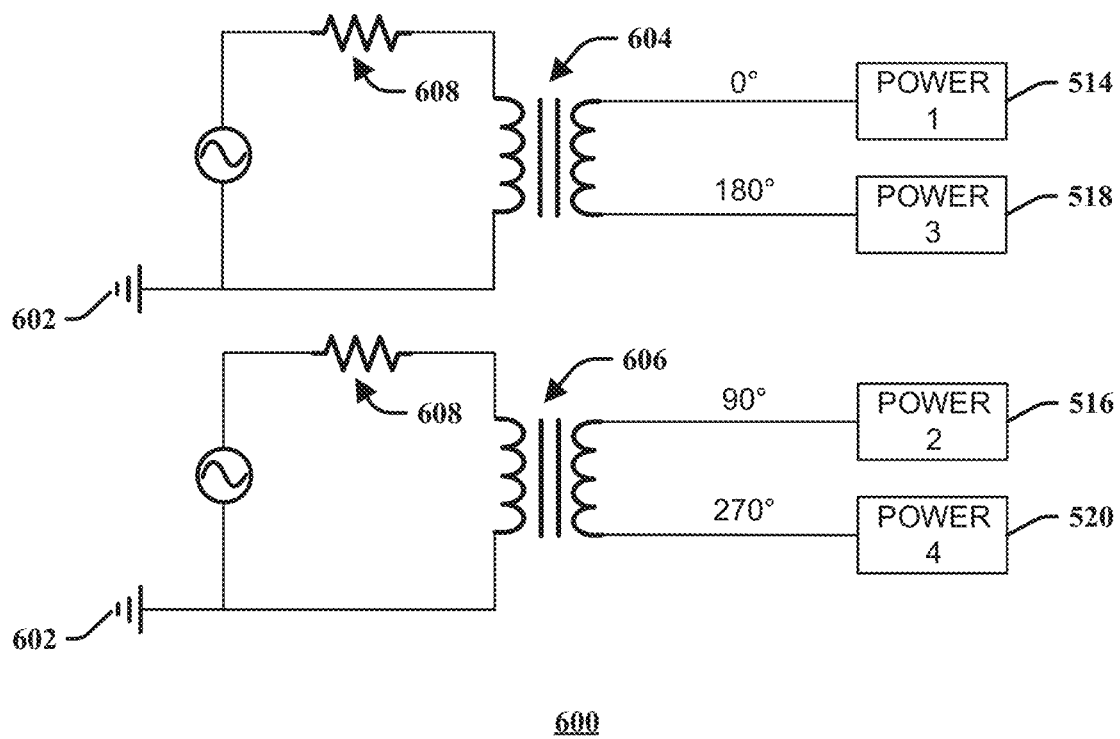
FIG. 7 is diagram illustrating a circuit used by an example implementation of at least a portion of one or more systems described herein.

FIG. 7 is diagram illustrating an exemplary electrical circuit 600 used by an example implementation of at least a portion of one or more systems described herein. In the exemplary electrical circuit 600, electrical devices (e.g., resistance(s) 608 and/or coupling inductance(s) 604, 606) may be used to modify the voltage, level and/or phases of a base power source 602. As a result, the power sources 514, 516, 518, 520 at an output end of the electrical circuit 600 may have different voltage phases. As an example, the first power source 514 and the third power source 518 may be electrically coupled with two output ends of a first coupling inductance 604, thereby comprising a 180° phase difference from each other. Further, a second coupling inductance 606 may be configured to have a 90° phase difference from the first coupling inductance 604. The second electrode 516 and the fourth electrode 520 may be electrically coupled with two output ends of the second coupling inductance 606, thereby comprising a 180° phase difference from each other. In this way, the phase difference between the first power source 514 and the second power source 516, the phase difference between the second power source 516 and the third power source 518, the phase difference between the third power source 518 and the fourth power source 520, and the phase difference between the fourth power source 520 and the first power source 514 can be 90°.

With reference to FIG. 6, in this example, with continued reference to FIG. 4B, a gap voltage may be the voltage applied at respective gaps 512 between the electrodes 504, 506, 508, 510. Further, in this example, a body voltage may be a voltage applied across the light emitting component 312b from first electrode in the electrode layer to the biometric object 318b (e.g., and/or from the biometric object to the second electrode). As an example, the body voltage may be half of the gap voltage, and the combined body voltages (e.g., to the biometric object and back) may be equivalent to the gap voltage. As described above, an electrical charge (e.g., 246 of FIG. 2) may move from the biometric object 318b, through the light emitting component 312b to a first electrode in the electrode layer, to a second electrode on the electrode layer, and through the light emitting component 312b back to the biometric object 318b.

In one implementation, by using the exemplary electrical circuit 600, the voltage phase difference between adjacent electrodes may be 90° when the electrodes 504, 506, 508, 510 are disposed in the fashion illustrated in FIG. 6 and connected to power sources 514, 516, 518, 520 respectively. In this way, a gap voltage at the electrode gaps 512 may have different characteristics than a body voltage on the electrodes 504, 506, 508, 510. For example, an average voltage gradient at the electrode gap 512 may be lower than an average voltage gradient at the electrodes 504, 506, 508, 510. In one example, having a lower average voltage gradient at the respective electrode gaps than at the electrodes can help to reduce or eliminate the appearance of bright lines that are indicative of electrode gaps on a relief print image, and thereby improving the quality of the relief print image.

Figure 8:
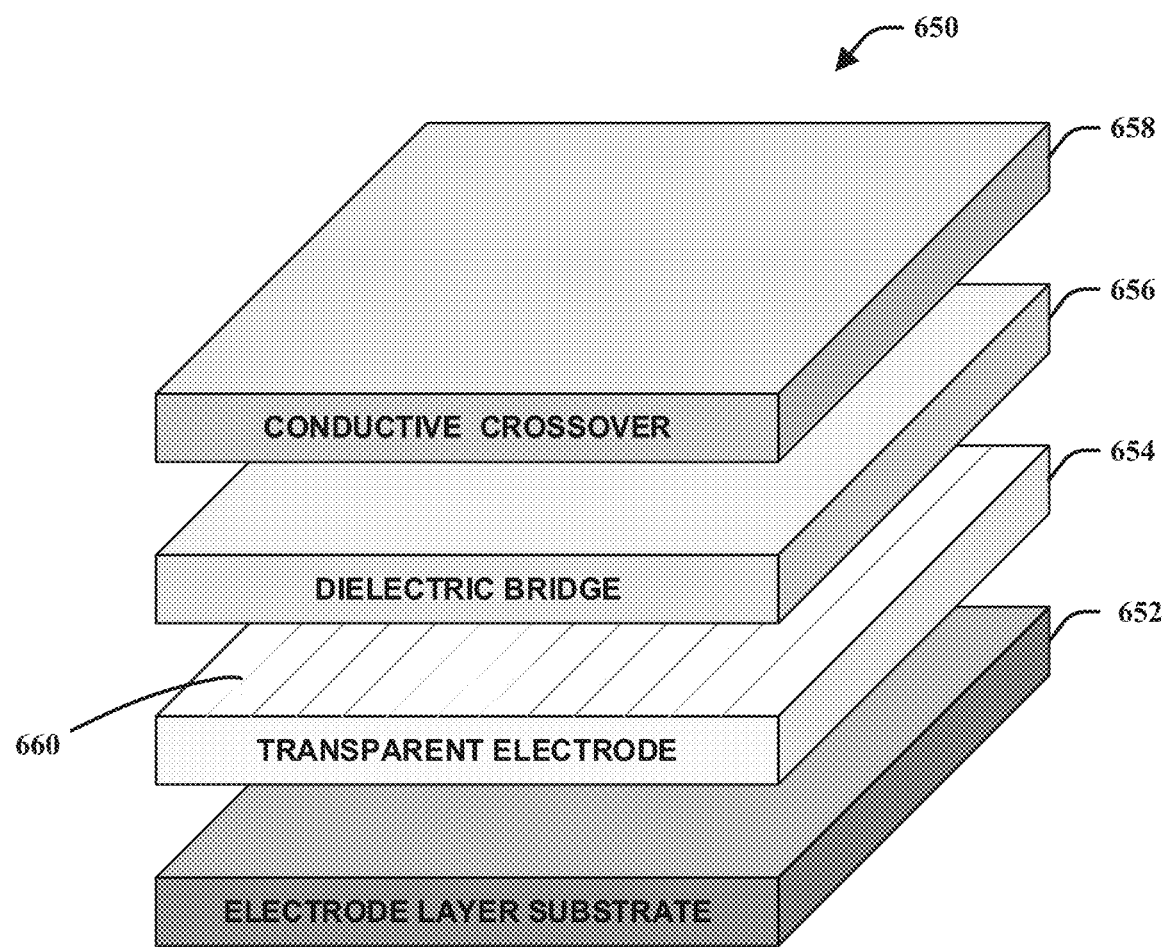
FIG. 8 is a component diagram illustrating an example implementation of at least a portion of one or more systems described herein.

FIG. 8 illustrates a component diagram of an example implementation of one or more portions of one or more systems described herein. As an example, an electrode layer 650 may comprise one or more layers, which can be used to provide voltage potential(s) to activate an electro-luminescent component of biometric relief print generator upon a contact from a biometric object. In the example implementation of FIG. 8, the electrode layer 650 can comprise an electrode layer substrate 652. As an example, the electrode layer substrate 652 may comprise any suitable insulating material (e.g., glass, polymer, polyester, etc.) configured to perform as a substrate onto which the other layers may be formed, and which comprise an optically transparent material. As an example, the substrate layer (402 of FIG. 5) of the light emitting layer (400 of FIG. 5) may function as the electrode layer substrate 502.

Further, the example electrode layer 650 can comprise a transparent electrode panel 654. As an example, the transparent electrode panel may have scribed lines 660 on at least one surface (e.g., a surface opposite to the surface contacting the electrode layer substrate 652). For example, the scribed line(s) 660 can be made using laser on a transparent, single-electrode panel (e.g., comprising an indium tin oxide (ITO) material) (e.g., or another optically transparent conductor). The scribed lines 660 may be used to create multiple electrodes (e.g., 504, 506, 508, 510 of FIG. 6) on the transparent electrode panel 654. As an example, the multiple electrodes may be connected to power sources with different voltage phases, which can be used in lieu of an exterior contact electrode to create a complete electric, as described in FIGS. 4B and 6.

As illustrated in FIG. 8, in one example, the electrode layer 650 can comprise a dielectric bridge layer 656, disposed on top of the transparent electrode panel 654. The dielectric bridge layer 656 may be configured to provide insulation and pass electrical current when appropriate (e.g. a conductive/insulating layer). As an example, the dielectric bridge layer 656 may be configured to cover a portion of the transparent electrode panel 654 where insulation is needed. The electrode layer 650 may further comprise a conductive crossover layer 658 disposed on top of the dielectric bridge layer 656. As an example, the conductive crossover layer 658 may comprise any suitable conductive material (e.g., metal, alloy, conductive polymer, etc.) configured to provide electrical connection between two conductive parts. For example, the conductive crossover layer 658 can be configured to provide electrical connection between the electrodes (e.g., 504, 506, 508, 510 in FIG. 6) and the power sources (e.g., 514, 516, 518, 520 in FIG. 6). The power source may have different phases (e.g., 90° apart from each other), such that different electrodes may have different voltage levels or phases at a given time when connected to the power sources.

Figure 9:
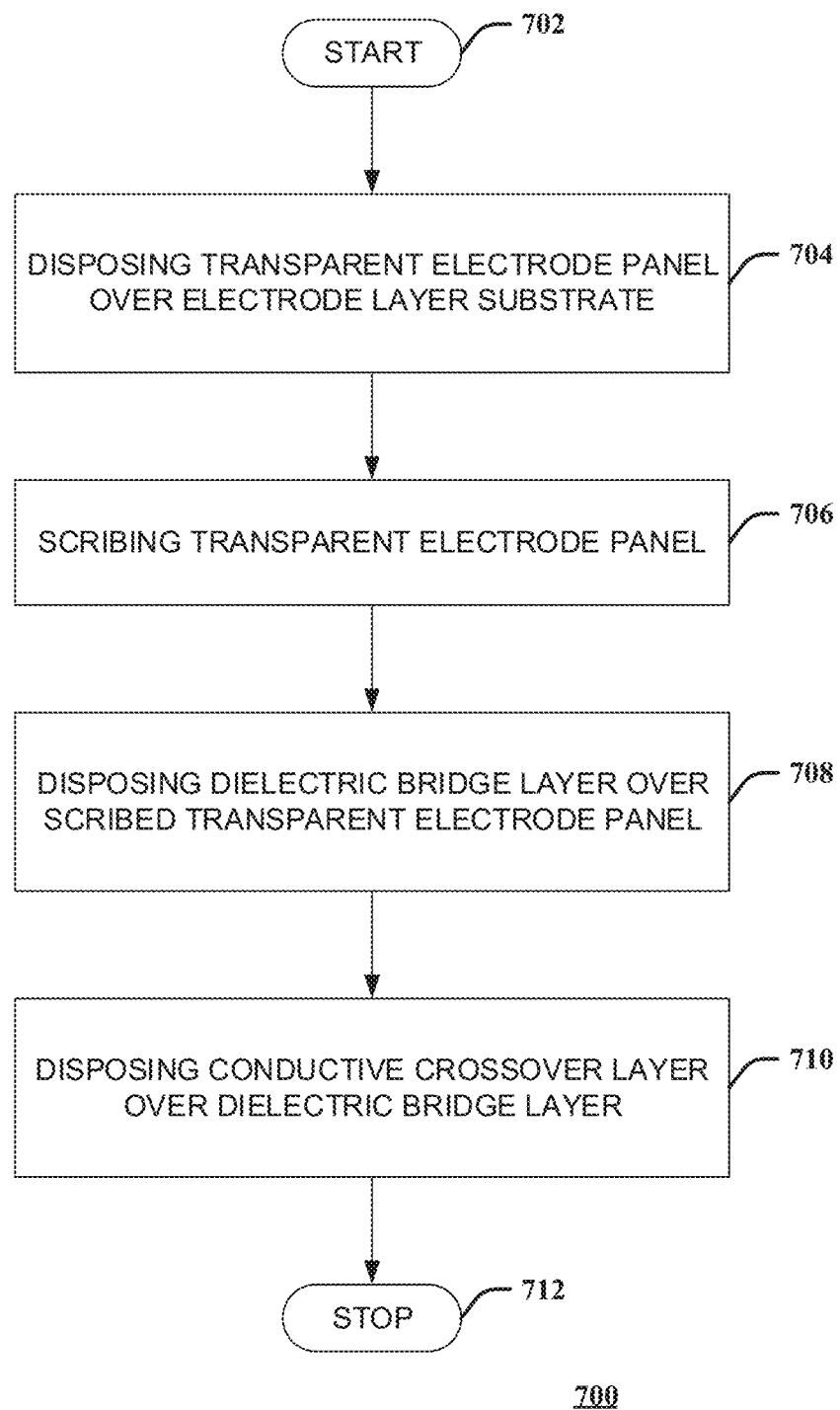
FIG. 9 is a flow diagram illustrating an exemplary method for manufacturing a component of a system for producing a relief print image.

FIG. 9 is a flow diagram illustrating an exemplary method 700 for manufacturing an electrode layer for a biometric relief print generator. The exemplary method 700 begins at 702. At 704, a transparent electrode panel is disposed over an electrode layer substrate. For example, the transparent electrode panel may comprise an indium tin oxide (ITO) material or another suitable conductive material which is optically transparent. At 706, the transparent electrode panel is scribed to create multiple electrodes. As an example, laser may be used to scribe a set of lines on the transparent electrode panel, resulting in electrodes separated by the scribed lines. The set of lines may be less than 1 pixel wide respectively, for example, thereby the scribe line may not compromise the quality of the relief print image indicative of a biometric object.

At 708, a dielectric bridge layer is disposed over the transparent electrode panel. The dielectric bridge layer may be configured to provide insulation at a portion of the transparent electrode panel and to pass electrical current at a different portion of the transparent electrode panel. At 710, a conductive crossover layer is disposed over the dielectric bridge layer. The conductive crossover layer may comprise a conductive material (e.g., metal, alloy, conductive polymer, etc.) and may be configured to provide electrical connection between two conductive components. For example, the conductive crossover layer may electrically connect the multiple electrodes in the transparent electrode panel to power sources. Additionally, as an example, the conductive crossover layer may be merely deposited over a portion of dielectric bridge layer. Having the conductive cross layer disposed over the dielectric bridge layer, the exemplary method 700 ends at 712.

Figure 10:
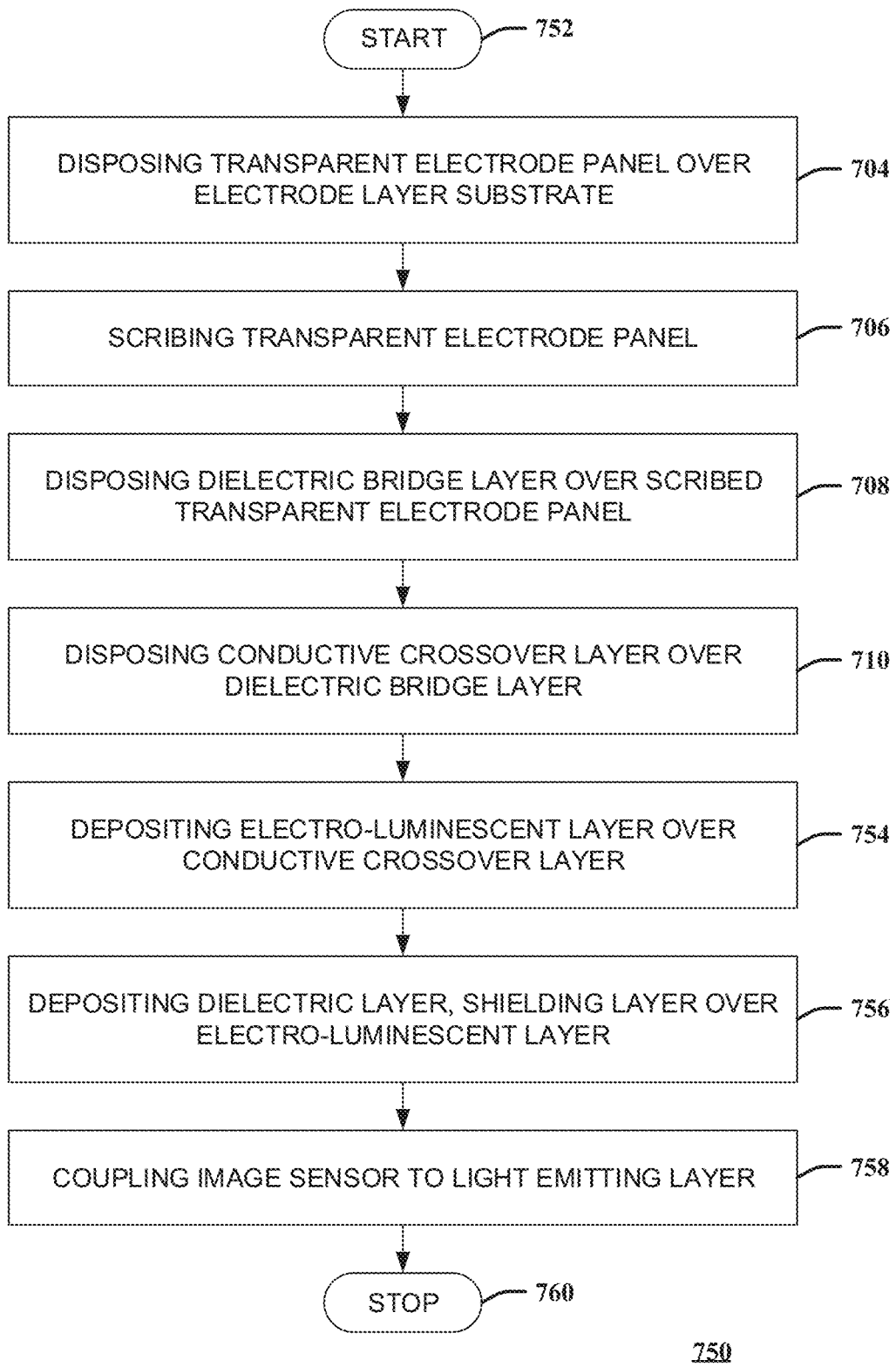
FIG. 10 is a flow diagram illustrating an exemplary method for manufacturing a system for producing a relief print image.

FIG. 10 is a flow diagram illustrating an exemplary method 750 for manufacturing a biometric relief print generator. The exemplary method 750 begins at 752. From 704 to 710, the same methods as in exemplary method 700 may be used to manufacture an electrode layer for the biometric relief print generator. At 704, a transparent electrode panel is disposed over an electrode layer substrate. At 706, the transparent electrode panel is scribed to create multiple electrodes. For example, laser may be used to scribe a set of lines on the transparent electrode panel. At 708, a dielectric bridge layer is disposed over the transparent electrode panel. The dielectric bridge layer may be configured to provide insulation and pass electrical current when appropriate. At 710, a conductive crossover layer is disposed over the dielectric bridge layer. The conductive crossover layer may be configured to provide electrical connection between two conductive components (e.g., between one of the electrodes and one of the power sources).

After having the electrode layer manufactured, at 754, an electro-luminescent layer may be deposited on the conductive crossover layer of the electrode layer, at a desired location. As an example, the electro-luminescent layer may comprise phosphor material or other suitable electro-luminescent material that can emit photons when activated by electrical charge. At 756, a dielectric layer and a shielding layer may be disposed over the electro-luminescent layer, and thereby a light emitting layer may be formed. The dielectric layer and the shielding layer may be separate layers, or may be an integral layer that is configured to both provide insulation and pass electrical current when appropriate, and to mitigate photon emission from one surface of the electro-luminescent layer. At 758, an image sensor may be coupled to the light emitting layer. The image sensor may be disposed in a path of directions of the photons emitted from the light emitting layer. For example, the image sensor may comprise two or more sensor arrays coupled together to convert emitted photons into electrical signals. Having the image sensor coupled to the light emitting layer, the exemplary method 750 ends at 760.

Figure 11:
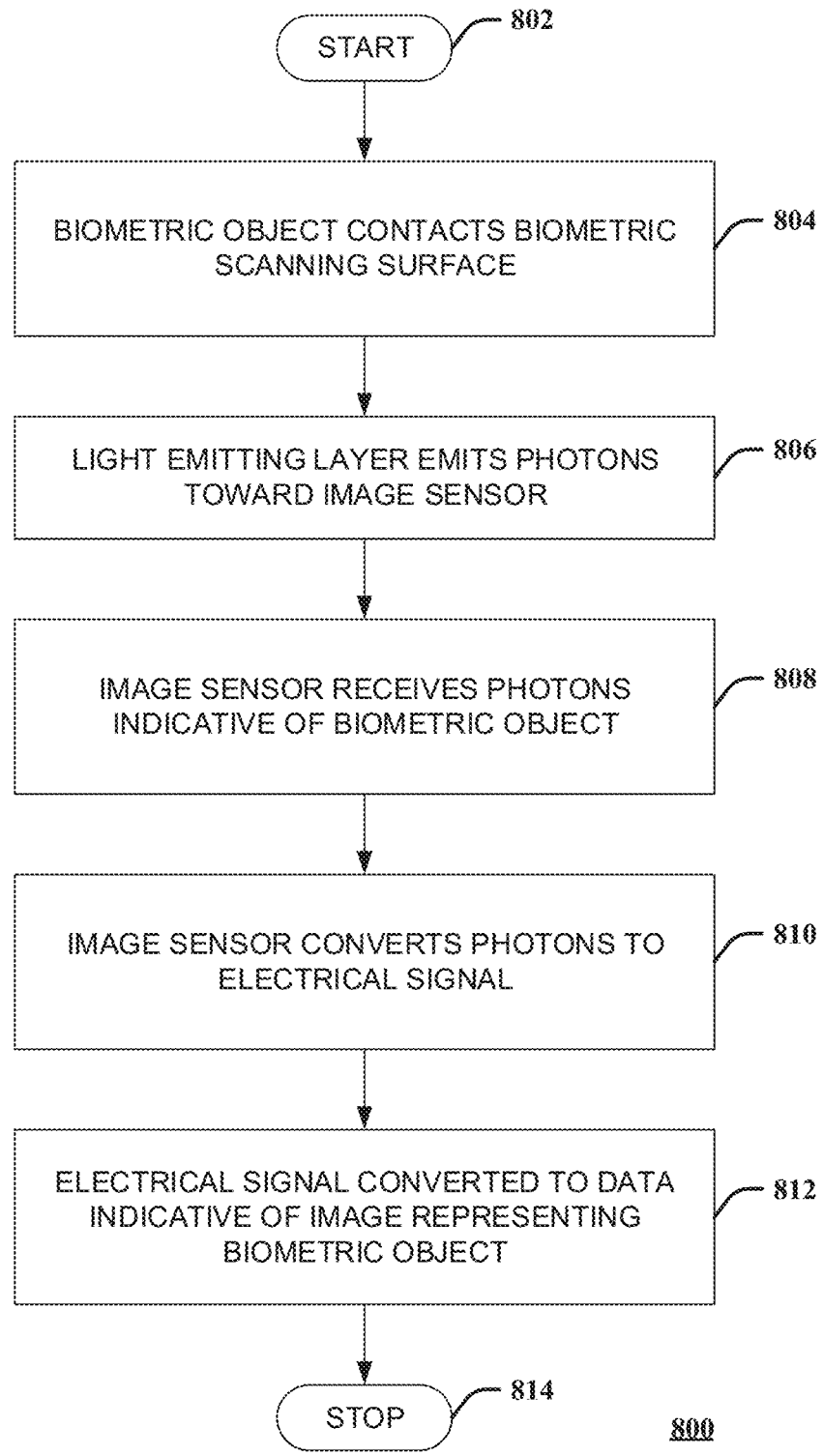
FIG. 11 is a flow diagram illustrating an exemplary method for using a biometric sensor.

FIG. 11 is a flow diagram illustrating an exemplary method 800 for using a biometric relief print generation system. The exemplary method 800 begins at 802. At 804, a biometric object may contact a scanning surface of the biometric relief print generation system. As an example, a user may contact the surface using a finger, two or more fingers, a hand, or other body parts. At 806, a light emitting layer may emit photons toward an image sensor arrangement. For example, as described above, the light emitting layer may covert an electrical charge, conducted by the biometric object, into photons indicative of the biometric object.

Further, as in one implementation, the image sensor arrangement may comprise an APS, TFT, CMOS, CCD, CIS, or some other light sensor that can convert photons into an electrical signal. In another implementation, the image sensor arrangement may be disposed beneath the light emitting layer as a thin film sensor (e.g., TFT or the like).

At 808 of the exemplary method 800, the image sensor arrangement can receive the photons indicative of the biometric object. That is, for example, the photons emitted by the light emitting layer may impact light sensitive portions of the image sensor arrangement, where the photons are indicative of an image of the object that contacted scanning surface at the electroluminescent layer location. At 810, the image sensor arrangement can convert the photons to electrical signals, as described above. At 812, the electrical signals can be converted to data indicative of an image representing at least a portion of the biometric object. That is, for example, the electrical signals can be indicative of a number and location of photons that impacted the image sensing component. In this example, the number and location of photons indicated by the electrical signals can be converted to image data representing an image of the object that contacted the surface (e.g., fingerprint(s) or handprint(s)).

Having converted the electrical signals to data indicative of an image of the biometric object, the exemplary method 800 ends at 814.

In another implementation, one or more of the systems and techniques, described herein, may be implemented by a computer-based system. An example computer-based system environment is illustrated in FIG. 11. The following discussion of FIG. 11 provides a brief, general description of a computing environment in/on which one or more or the implementations of one or more of the methods and/or system set forth herein may be implemented. The operating environment of FIG. 11 is merely an example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, mobile consoles, tablets, media players, and the like), multiprocessor systems, consumer electronics, mini computers, mainframe computers, distributed computing environments that include any of the above systems or devices, and the like.

Although not required, implementations are described in the general context of "computer readable instructions" executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

Figure 12:
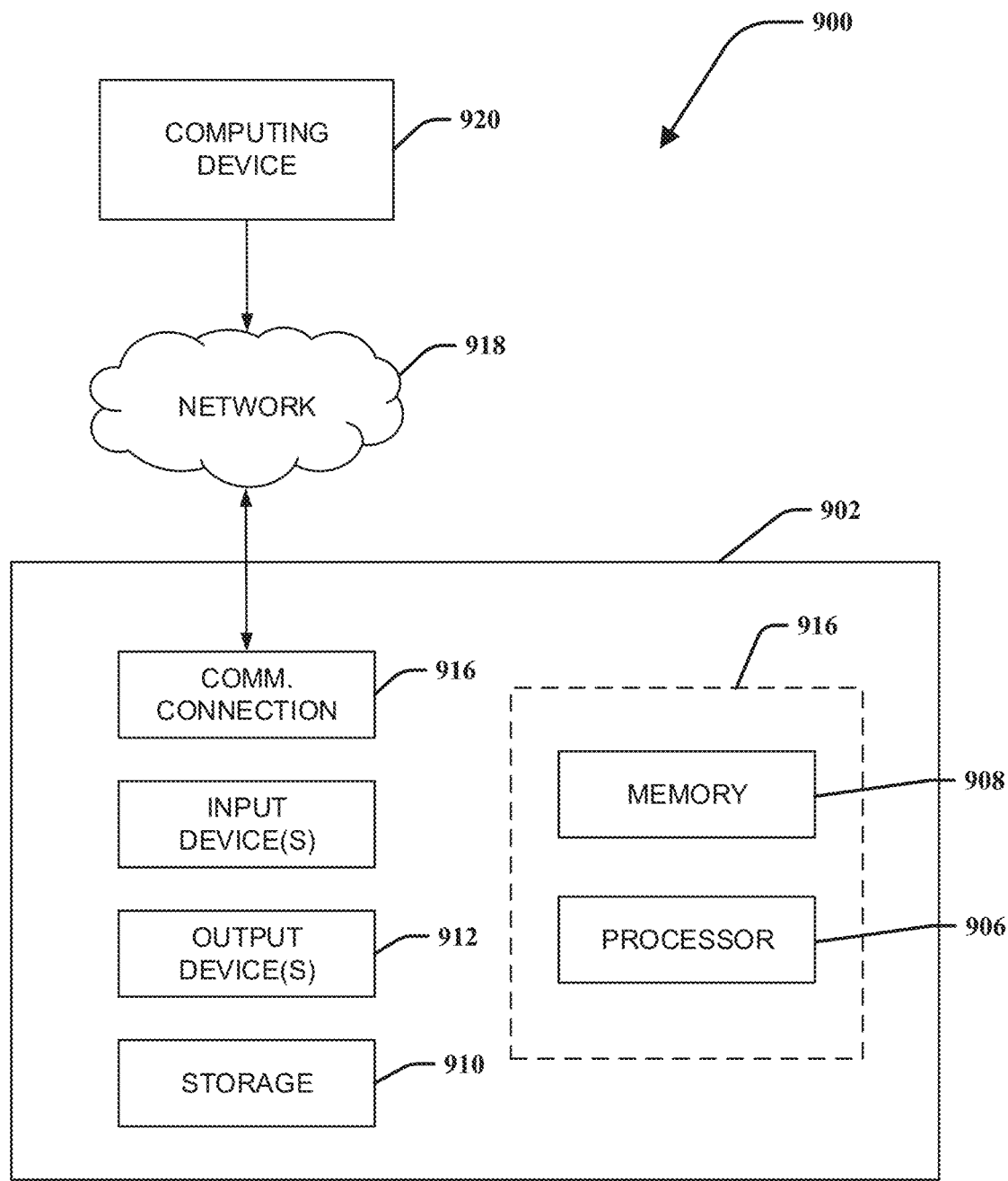
FIG. 12 illustrates an exemplary computing environment wherein one or more of the provisions set forth herein may be implemented.

FIG. 12 illustrates an example of a system 900 comprising a computing device 902 configured to implement one or more implementations provided herein. In one configuration, computing device 902 includes at least one processing unit 906 and memory 908. Depending on the exact configuration and type of computing device, memory 908 may be volatile (such as RAM, for example), non-volatile (such as ROM, flash memory, etc., for example) or some combination of the two. This configuration is illustrated in FIG. 11 by dashed line 904.

In other implementations, device 902 may include additional features and/or functionality. For example, device 902 may also include additional storage (e.g., removable and/or non-removable) including, but not limited to, magnetic storage, optical storage, and the like. Such additional storage is illustrated in FIG. 11 by storage 910. In one implementation, computer readable instructions to implement one or more implementations provided herein may be in storage 910. Storage 910 may also store other computer readable instructions to implement an operating system, an application program and the like. Computer readable instructions may be loaded in memory 908 for execution by processing unit 906, for example.

The term "computer readable media" as used herein includes computer storage media. Computer storage media includes volatile and nonvolatile, removable and non-removable media implemented in any method or technology for storage of information such as computer readable instructions or other data. Memory 908 and storage 910 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 902. Any such computer storage media may be part of device 902.

Device 902 may also include communication connection(s) 916 that allows device 902 to communicate with other devices. Communication connection(s) 916 may include, but is not limited to, a modem, a Network Interface Card (NIC), an integrated network interface, a radio frequency transmitter/receiver, an infrared port, a USB connection or other interfaces for connecting computing device 902 to other computing devices. Communication connection(s) 916 may include a wired connection (e.g., data bus) or a wireless connection (e.g., wireless data transmission). Communication connection(s) 916 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 902 may include input device(s) 904 such as keyboard, mouse, pen, voice input device, touch input device, infrared cameras, video input devices, and/or any other input device. Output device(s) 912 such as one or more displays, speakers, printers, and/or any other output device may also be included in device 902. Input device(s) 914 and output device(s) 912 may be connected to device 902 via a wired connection, wireless connection, or any combination thereof. In one implementation, an input device or an output device from another computing device may be used as input device(s) 914 or output device(s) 912 for computing device 902.

Components of computing device 902 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another implementation, components of computing device 902 may be interconnected by a network. For example, memory 908 may be comprised of multiple physical memory units located in different physical locations interconnected by a network.

Those skilled in the art will realize that storage devices utilized to store computer readable instructions may be distributed across a network. For example, a computing device 920 accessible via network 918 may store computer readable instructions to implement one or more implementations provided herein. Computing device 902 may access computing device 920 and download a part or all of the computer readable instructions for execution. Alternatively, computing device 902 may download pieces of the computer readable instructions, as needed, or some instructions may be executed at computing device 902 and some at computing device 920.

The word "exemplary" is used herein to mean serving as an example, instance or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Further, at least one of A and B and/or the like generally means A or B or both A and B. In addition, the articles "a" and "an" as used in this application and the appended claims may generally be construed to mean "one or more" unless specified otherwise or clear from context to be directed to a singular form.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Of course, those skilled in the art will recognize many modifications may be made to this configuration without departing from the scope or spirit of the claimed subject matter.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure.

In addition, while a particular feature of the disclosure may have been disclosed with respect to only one of several implementations, such feature may be combined with one or more other features of the other implementations as may be desired and advantageous for any given or particular application. Furthermore, to the extent that the terms "includes," "having," "has," "with," or variants thereof are used in either the detailed description or the claims, such terms are intended to be inclusive in a manner similar to the term "comprising."

What is claimed is:

1. A system to generate relief print data, comprising:
a light emitting layer to generate photons indicative of a biometric relief print, comprising:
an electro-luminescent layer configured to emit the photons in response to a biometric object contacting a biometric scanning surface disposed above light emitting layer; and
an electrode layer disposed beneath the electro-luminescent layer, the electrode layer comprising more than one electrode, wherein the respective electrodes of the electrode layer are coupled with a power source each power source having a different voltage phase; and
an image sensor disposed beneath the light emitting layer in a path of the emitted photons to convert the photons to an electrical signal indicative of at least a portion of the biometric relief print.

2. The system of claim 1, wherein the electrode layer comprises four electrodes, the respective electrodes coupled with a power source with a voltage phase 90° apart from the voltage phase of the power source coupled with an adjacent electrode, resulting in a gradient of a gap voltage at a gap of two electrodes lower than a gradient of a body voltage on the electrodes.

3. The system of claim 1, wherein the electrode layer further comprises one or more of:
a transparent electrode layer with scribed lines;
a dielectric bridge layer;
a conductive crossover layer; and
an electrode layer substrate.

4. The system of claim 1, wherein the electro-luminescent layer is configured to emit photons in response to an electrical charge received from the biometric object upon contacting the biometric scanning surface.

5. The system of claim 1, wherein the image sensor is communicatively coupled with one or more of:
an image processor configured to convert the electrical signal indicative of the biometric relief print into image data indicative of the biometric object; and
a data processor configured to use the image data to initiate a function.

6. The system of claim 1, wherein the light emitting layer further comprises a shielding layer, disposed over the electro-luminescent layer and configured to mitigate emissions of photons from a top surface of the electro-luminescent layer.

7. The system of claim 1, wherein the light emitting layer further comprises a dielectric layer disposed above the electro-luminescent layer.

8. The system of claim 1, wherein a shielding layer, a dielectric layer and a protective layer are integrally formed as a top layer, the top layer disposed over the electro-luminescent layer.

9. The system of claim 1, wherein the light emitting layer further comprise one or more of:
one or more polarizing layers disposed between the electro-luminescent layer and the sensor component;
one or more light shielding pattern layers configured to direct emitting photons in a desired pattern toward the sensor component; and
one or more adherence layers disposed between one or more layers.

10. The system of claim 1, further comprising a protective layer disposed over the light emitting layer utilized as the biometric scanning surface, the protective layer comprising one or more of:
an abrasion resistive layer;
a liquid resistive layer; and
a shock resistive layer.

11. The system of claim 1, wherein the sensor component further comprises one or more of:
a photo-sensitive thin film transistor (TFT);
a thin film photo-diode;
a complementary metal-oxide semiconductor (CMOS) image sensor; and
a charge-couple devise (CCD) image sensor.

12. The system of claim 1, wherein the electro-luminescent layer operates in a voltage range of sixty to six-hundred volts.

13. A method for manufacturing a device for producing a biometric relief print image, comprising:
forming a light emitting layer component to generate photons indicative of a biometric relief print, the light emitting layer comprising:
an electro-luminescent layer configured to emit photons in response to an electrical charge received from the biometric object upon contacting a biometric scanning surface disposed above the light emitting layer; and
an electrode layer disposed beneath the electro-luminescent layer, the electrode layer comprising more than one electrode;
connecting the electrode layer with more than one power source with different voltage phases, wherein the respective electrodes of the electrode layer are coupled with a power source each power source having a different voltage phase;
disposing the light emitting layer over a light sensing layer such that the light sensing layer lies in a path of the photons emitted from the light emitting layer, wherein the light sensing layer converts the photons to an electrical signal indicative of at least a portion of the biometric relief print; and
communicatively coupling an image processor with the light sensing layer to convert the electrical signal indicative of the biometric relief print into image data indicative of the biometric object.

14. The method of claim 13, wherein forming the light emitting layer further comprises one or more of:
forming the electrode layer;
disposing the electro-luminescent layer over the electrode layer; and
disposing a dielectric layer over the electro-luminescent layer.

15. The method of claim 13, wherein forming the light emitting layer further comprises forming the electrode layer, comprising one or more of:
disposing a transparent electrode panel over an electrode layer substrate;
scribing the transparent electrode panel using laser, resulting in more than one electrodes;
disposing a dielectric bridge layer over the scribed transparent electrode panel; and disposing a conductive crossover layer over the dielectric bridge layer.

16. The method of claim 13, further comprising one or more of:
   disposing a shielding layer over the electro-luminescent layer to mitigate emission of photons from a top surface of the electro-luminescent layer; and
   disposing a protective layer over the light emitting layer utilized as the biometric scanning surface, the protective layer comprising one or more of:
      an abrasion resistive layer;
      a liquid resistive layer; and
      a shock resistive layer.

17. The method of claim 13, forming the light-emitting layer further comprising one of more of:
   disposing one or more polarizing layer between the electro-luminescent layer and the light sensing layer; and
   disposing one or more light shielding pattern layer between the electro-luminescent layer and the light sensing layer, the light shielding pattern layers configured to direct emitting photons in a desired pattern toward the light sensing layer; and
   utilizing one or more adherent layer to adhere at least two layers in the light emitting layer.

18. A system to generate relief print data, comprising:
   a light emitting layer to generate photons indicative of a biometric relief print, comprising:
      an electro-luminescent layer configured to emit the photons in response to an electrical charge received from a biometric object upon contacting a biometric scanning surface disposed above the light emitting layer; and
      an electrode layer disposed beneath the electro-luminescent layer, the electrode layer comprising:
         four electrodes, the respective electrodes coupled with a power source with a voltage phase 90° apart from the voltage phase of the power source coupled with an adjacent electrode, resulting in a gradient of a gap voltage at a gap of two electrodes lower than a gradient of a body voltage on the electrodes;
         a transparent electrode layer with scribed lines;
         a dielectric bridge layer;
         a conductive crossover layer; and
         an electrode layer substrate;
      a shielding layer disposed over the electro-luminescent layer and configured to mitigate emissions of photons from a top surface of the electro-luminescent layer;
      a dielectric layer disposed over the shielding layer;
      one or more polarizing layer disposed between the electro-luminescent layer and the sensor component;
      one or more light shielding pattern layer configured to direct emitting photons in a desired pattern toward the light sensing layer; and
      one or more adherence layer between one or more layers;
   a protective layer over the light emitting layer to be utilized as the biometric scanning surface, the protective layer comprising one or more of:
      an abrasion resistive layer;
      a liquid resistive layer; and
      a shock resistive layer; and
   an image sensor disposed beneath the light emitting layer in a path of the emitted photons to convert the photons to an electrical signal indicative of at least a portion of the biometric relief print, the sensor component communicatively coupled with one or more of:
      an image processor configured to convert the electrical signal indicative of the biometric relief print into image data indicative of the biometric object; and
      a data processor configured to use the image data to initiate a function, the sensor component further comprises one or more of:
      a photo-sensitive thin film transistor (TFT);
      a thin film photo-diode:
      a complementary metal-oxide semiconductor (CMOS) image sensor; and
      a charge-couple devise (CCD) image sensor.

* * * * *